United States Patent [19]
Choi

[11] Patent Number: 5,970,339
[45] Date of Patent: Oct. 19, 1999

[54] METHOD OF MANUFACTURING A DYNAMIC ACCESS MEMORY WHICH IS SUITABLE FOR INCREASING INTEGRATION AND SUPPRESSING GENERATION OF LEAKAGE CURRENT USING AN SOI STRUCTURE

[75] Inventor: Jong Moon Choi, Seoul, Rep. of Korea

[73] Assignee: LG Semicon Co., Ltd., Chungcheongbuk-DO, Rep. of Korea

[21] Appl. No.: 08/840,700

[22] Filed: Apr. 25, 1997

[30] Foreign Application Priority Data

Nov. 7, 1996 [KR] Rep. of Korea ................ 96-52559

[51] Int. Cl.⁶ ............................................. H01L 21/8242
[52] U.S. Cl. ........................ 438/243; 438/386; 257/301
[58] Field of Search .................................. 438/152, 243, 438/244, 245, 246, 247, 248, 249, 386, 387, 388, 389, 390, 391, 392; 257/301

[56] References Cited

U.S. PATENT DOCUMENTS

| | | | |
|---|---|---|---|
| 5,504,027 | 4/1996 | Jeong et al. | 438/244 |
| 5,508,219 | 4/1996 | Bronner et al. | 438/152 |
| 5,525,531 | 6/1996 | Bronner et al. | 438/152 |
| 5,585,285 | 12/1996 | Tang | 438/152 |
| 5,618,745 | 4/1997 | Kita | 438/386 |
| 5,627,092 | 5/1997 | Alsmeier et al. | 438/152 |

OTHER PUBLICATIONS

"ULSI DRAM/SIMOX with Stacked Capacitor Cells for Low–Voltage Operation" by T. Eimori et al, IEDM (1993) pp. 45–48.

*Primary Examiner*—Peter Toby Brown
*Assistant Examiner*—Toniae M. Thomas

[57] ABSTRACT

A dynamic random access memory (DRAM) and a method of manufacturing the same which is suitable for increasing the integration of a semiconductor device and suppressing the generation of a leakage current using a silicon-on-insulator (SOI) structure are disclosed. The semiconductor device includes a semiconductor substrate, an insulating film formed on the semiconductor substrate, a semiconductor layer pattern formed on the insulating film, a trench formed in the semiconductor substrate through the semiconductor layer pattern and the insulating film, an electrode of a capacitor formed in the trench for electrically connected to the semiconductor layer pattern, a gate insulating film formed on the semiconductor layer pattern, a gate electrode formed on the gate insulating film, and impurity regions formed in the semiconductor layer pattern.

25 Claims, 11 Drawing Sheets

FIG.4m-1
FIG.4m-2
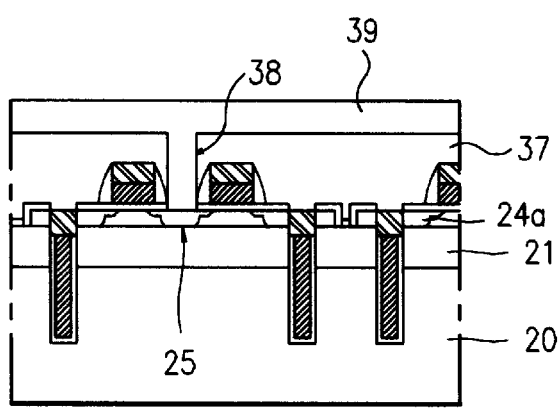
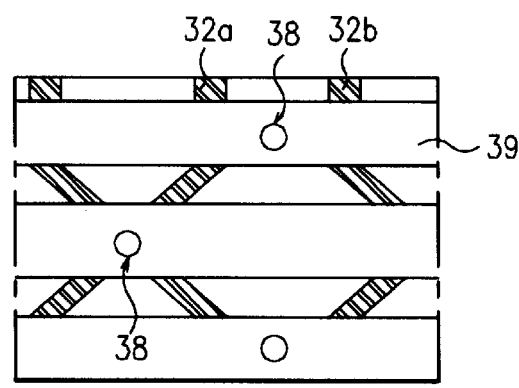

METHOD OF MANUFACTURING A DYNAMIC ACCESS MEMORY WHICH IS SUITABLE FOR INCREASING INTEGRATION AND SUPPRESSING GENERATION OF LEAKAGE CURRENT USING AN SOI STRUCTURE

BACKGROUND OF THE INVENTION

1. Field of the Invention

The present invention relates to a semiconductor device and, more particularly, to a dynamic random access memory (DRAM) and a method of manufacturing the same which is suitable to increase integration and suppress generation of a leakage current utilizing a silicon-on-insulator (SOI) structure.

2. Discussion of Related Art

In general, a DRAM has a large memory capacity and is suitable as a semiconductor memory device for a personal computer.

A DRAM cell is profitable for high integration and has a cost per bit which is lower than that of a static random access memory (SRAM) since the DRAM cell is composed of a capacitor and a MOS (Metal-Oxide-Silicon) transistor. Thus the DRAM cell is mainly utilized as a memory device.

A memory cell region of a DRAM can utilize an N-type MOS (NMOS) which has a high carrier mobility. The memory cell region includes a capacitor formed therein. In a periphery circuit area of the DRAM, a C-type MOS (CMOS) with a low power consumption is utilized separately. The DRAM is classified as MOS memory devices, where the MOS memory devices are divided into an NMOS and a CMOS as described above.

The CMOS is divided into a bulk CMOS and a SOI (silicon-on-insulator) CMOS. In the bulk CMOS, semiconductor elements are formed on a semiconductor substrate, whereas in the SOI CMOS, a single crystalline silicon thin film is formed on an insulating layer and semiconductor elements are formed thereon.

The SOI structure in the SOI CMOS prevents latch-ups and soft errors occurring in conventional CMOS circuits since the SOI structure is not influenced by parasitic effects related to the substrate of the CMOS circuit.

The SOI technology is divided into an epitaxial growth method, a deposited film recrystallization method, and a single crystal isolation method.

In the epitaxial growth method, single crystalline silicon is grown on a single crystalline insulating layer such as sapphire. A typical epitaxial growth method is a silicon-on-sapphire (SOS) technique.

In the deposited film recrystallization method, a polycrystalline or amorphous silicon thin film is deposited on an oxide film. The deposited film is melted and recrystallized in a horizontal direction, or it is solid-phase epitaxialized (solid phase epitaxy technique).

In the deposited film recrystallization method using the melting and recrystallization technique, a polycrystalline silicon thin film is deposited on an oxide film using a CVD (chemical vapor deposition) method, and heated and melted by an energy beam such as a laser beam and an electron beam. The melted region is recrystallized on a wafer to obtain a single crystalline thin film. On the other hand, using the solid phase epitaxy technique, an amorphous silicon film is deposited on various crystalline regions of an insulating film on a substrate and is epi-grown by annealing.

In the single crystal isolation method, an insulating layer such as an oxide film is buried within a semiconductor substrate. An oxygen ion or nitrogen ion is implanted into a single crystalline silicon substrate to form a buried oxide or nitride layer while the surface of the single crystal silicon remains unchanged. This process of implanting the oxygen ion is called "Separation by IMplanted OXygen" (SIMOX).

The SOI CMOS is superior than the bulk CMOS since the SOI structure having complete isolation structure offers many merits. For example, the SOI CMOS has a low power consumption, high integration, a high soft-error resistance, a high latch-up resistance and a high speed operation, compared to the bulk CMOS.

A conventional DRAM using SOI and a method of manufacturing the same will be described with reference to the attached drawings.

FIG. 1 is a cross-sectional view showing the structure of a conventional DRAM using SOI.

As shown in FIG. 1, the conventional DRAM using SOI includes a stack type capacitor formed on a SOI substrate which is formed by the SIMOX method. A buried oxide layer 2 is formed on a semiconductor substrate 1 and a SOI layer 3 is formed on the buried oxide film 2. Field shields 4 are formed at certain intervals on a device isolation region of the SOI layer 3. In an active region formed between the field shields 4, a first gate electrode 6a and a second gate electrode 6b are formed. First, second and third impurity diffusion regions 7a, 7b and 7c are formed in the SOI layer 3 on both sides of first and second gate electrodes 6a and 6b.

On the first impurity diffusion region 7a between the first gate electrode 6a and the field shield 4, a capacitor composed of a storage node 10, a dielectric film 11 and a plate node 12, is formed. The capacitor having the above structure is also formed on the third impurity diffusion region 7c between the second gate electrode 6b and the field shield 4. On the second impurity diffusion region 7b between the first and second gate electrodes 6a and 6b, a polysilicon pad 14 for connecting with a bitline 16 is formed over a capacitor insulating film 13. A planarizing layer 15 is formed on the capacitor insulating film 13 and polysilicon pad 14. The bit line 16 is formed on the planarizing layer 15 and connects with the polysilicon pad 14 through a contact hole formed in the planarizing layer 15. First, second and third oxide films 5, 8 and 9 formed between the above layers function as insulating layers.

FIGS. 2a to 2h are cross-sectional views for illustrating a method of manufacturing the conventional DRAM having the structure shown in FIG. 1.

As shown in FIG. 2a, using the SIMOX method an oxygen ion is implanted into the semiconductor substrate 1 in which a field region (F) and an active region (A) are defined. The implanted oxygen ion is heat-treated to form the buried oxide film 2 in the surface of the substrate 1. At this time, the semiconductor substrate 1 is a single crystalline silicon substrate. On the buried oxide film 2, a single crystalline SOI layer 3 is formed.

As shown in FIG. 2b, the field shields 4 and the first oxide film 5 are sequentially formed on the SOI layer 3 above the field regions.

As shown in FIG. 2c, polysilicon is deposited on the entire surface of the first oxide film 5 and the SOI layer 3, and selectively patterned by photolithography and etching process to form the first and second gate electrodes 6a and 6b. Then the second oxide film 8 for protecting the gate electrodes 6a and 6b is formed over of the first and second gate electrodes 6a and 6b. Impurity ions are implanted into the SOI layer 3 on both sides of the first and second gate electrodes 6a and 6b by an ion-implantation process using the first and second gate electrodes 6a and 6b as a mask. As a result, the first, second and third impurity diffusion regions 7a, 7b and 7c are formed as source/drain regions.

As shown in FIG. 2d, the third oxide film 9 is formed on the entire surface including the first and second gate electrodes 6a and 6b. Then the third oxide film 9 is selectively removed from the first and third impurity diffusion regions 7a and 7c to form node contact holes 17 above the first and third impurity diffusion regions 7a and 7c.

As shown in FIG. 2e, a polysilicon layer is formed on the entire surface of the substrate including the node contact holes 17, and selectively removed to form the storage node 10. The dielectric film 11 is formed on the surface of storage node 10. A polysilicon layer is formed on the entire surface including the dielectric film 11, and etched to form the plate node 12.

As shown in FIG. 2f, the capacitor insulting film 13 as a fourth oxide film is formed on the entire surface including the plate node 12. Portions of the capacitor insulating film 13 and third oxide film 9 formed on the second impurity diffusion region 7b between the first and second gate electrodes 6a and 6b are selectively removed to form a bitline contact hole 18.

As shown in FIG. 2g, a polysilicon layer is formed on the entire surface including the bitline contact hole 18 and patterned selectively to form the polysilicon pad 14 on the second impurity diffusion region 7b.

As shown in FIG. 2h, the planarizing layer 15 is formed on the entire surface of capacitor insulating film 13 and the polysilicon pad 14. A contact hole is formed through the planarizing layer 15 to expose a portion of the polysilicon pad 14. Then a polysilicon layer is deposited on the entire surface of planarizing layer 15 and in the contact hole to form the bitline 16. The bitline 16 contacts the polysilicon pad 14 through the contact hole.

The conventional DRAM and the conventional method of manufacturing the same, however, have the following problems.

First, since the bitline is formed above the storage node, the enlargement of the storage node is limited because the enlargement of the storage node may interfere with the bitline contact.

Secondly, since the oxide film is formed within the substrate by the SIMOX method, crystal defects may occur in the SOI layer formed on the oxide film during the oxygen ion implantation and heat treatment process. Thus, improvement in the yield of the wafer is limited.

SUMMARY OF THE INVENTION

Accordingly, the present invention is directed to a semiconductor device and a method of manufacturing the same that substantially obviates one or more of the problems due to limitations and disadvantages of the related art.

An object of the present invention is to provide a DRAM and a method of manufacturing the same which is suitable to increase integration and suppress the generation of a leakage current.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, there is provided a semiconductor device including a semiconductor substrate serving as a first electrode of a capacitor; an insulating film formed on the semiconductor substrate; a semiconductor layer pattern formed on the insulating film; a trench extending to the semiconductor layer pattern, the insulating film and the semiconductor substrate; a dielectric film formed along the surface of the semiconductor substrate in the trench; a second electrode of the capacitor formed on the dielectric film of the trench and connected electrically to the semiconductor layer pattern; a gate insulating film formed on the semiconductor layer pattern; a gate electrode formed on the gate insulating film; and impurity regions formed within the semiconductor layer pattern on both sides of the gate electrode.

Further, there is provided a method of manufacturing a semiconductor, including the steps of forming an insulating film pattern on a semiconductor substrate; forming a semiconductor layer pattern on the semiconductor substrate and the insulating film pattern; sequentially forming a gate insulating film and a first conductive layer on the semiconductor layer pattern; forming a trench extending to the first conductive layer, the gate insulating film, the semiconductor layer pattern, the insulating film pattern and the semiconductor substrate; forming a dielectric film on the surface of the semiconductor substrate in the trench; forming a second conductive layer on the entire surface of the dielectric film of the trench; forming a third conductive layer in the trench and on the first conductive layer; patterning the first and third conductive layers to form a gate electrode composed of the first and third conductive layer on the gate insulating film and to left the third conductive layer on the second conductive layer within the trench; and forming impurity regions in the semiconductor layer pattern on both sides of the gate electrode.

It is to be understood that both the foregoing general description and the following detailed description are exemplary and explanatory and are intended to provide further explanation of the invention as claimed.

Briefly described, the present invention is directed to a semiconductor device including a semiconductor substrate, an insulating film formed on the semiconductor substrate, a semiconductor layer pattern formed on the insulating film, a trench formed in the semiconductor substrate through the semiconductor layer pattern and the insulating film, an electrode of a capacitor formed in the trench for electrically connected to the semiconductor layer pattern, a gate insulating film formed on the semiconductor layer pattern, a gate electrode formed on the gate insulating film, and impurity regions formed in the semiconductor layer pattern.

Furthermore, the present invention is directed to a method of manufacturing a semiconductor device, including the steps of forming an insulating film pattern on a semiconductor substrate; forming a semiconductor layer pattern on the insulating film pattern; sequentially forming a gate insulating film and a first conductive layer on the semiconductor layer pattern; forming a trench in the semiconductor substrate through the first conductive layer, the gate insulating film, the semiconductor layer pattern, and the insulating film pattern; forming an electrode of a capacitor in the trench; forming a gate electrode on the gate insulating film; and forming impurity regions in the semiconductor layer pattern.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings, wherein:

FIGS. 4a-1 selectively to 4m-1 and FIGS. 4a-a selectively to 4m-2 show cross sectional views and top plan views, respectively, for illustrating a method of manufacturing the DRAM, taken along line IV–IV' of FIG. 3a.

DETAILED DESCRIPTION OF PREFERRED EMBODIMENTS

Reference will now be made in detail to the preferred embodiments of the present invention, examples of which are illustrated in the accompanying drawings.

Figure 3A:
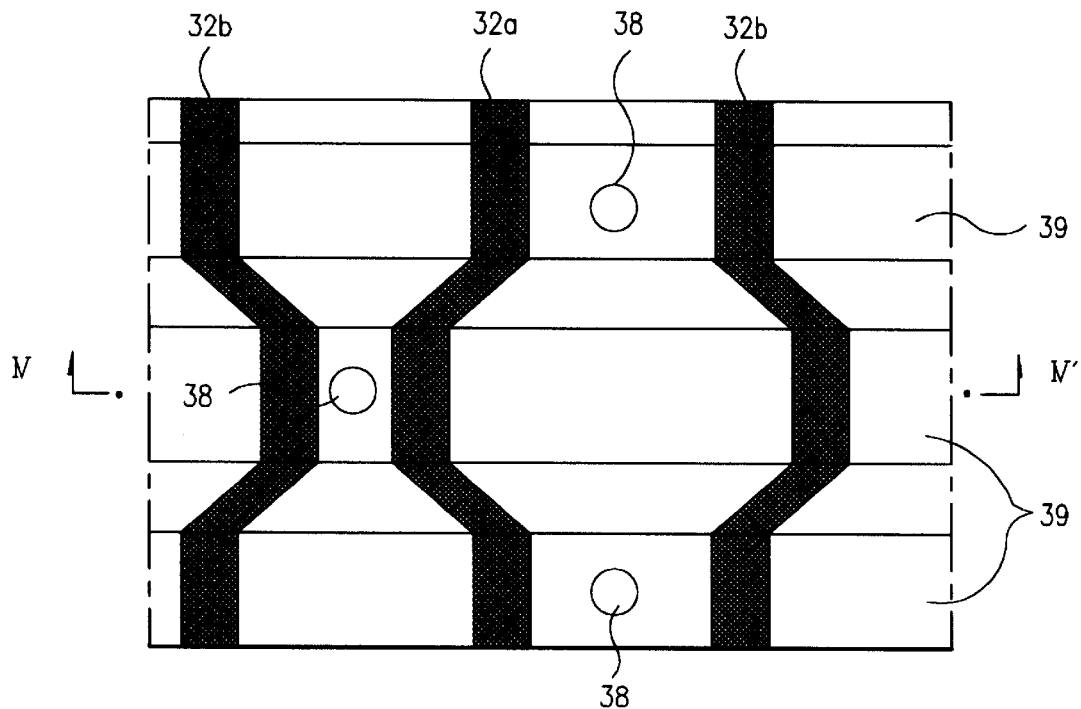
FIG. 3a is a layout diagram of a DRAM in accordance with the embodiments of the present invention.
Figure 3B:
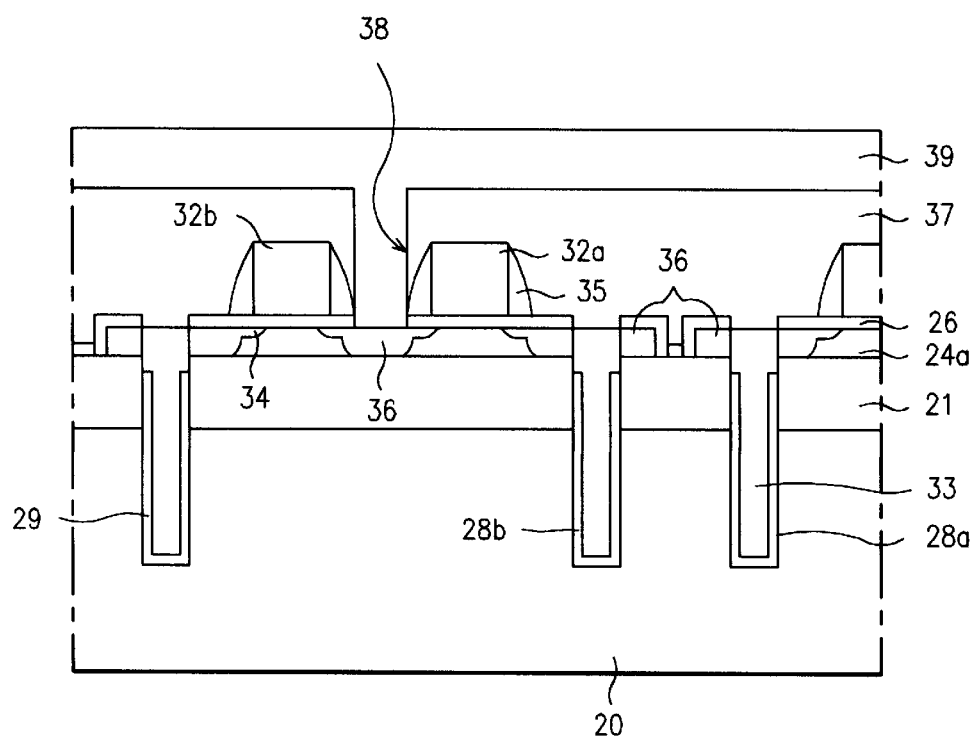
FIG. 3b is a cross-sectional view of the structure of the DRAM in accordance with the embodiments of the present invention.

FIG. 3a is a layout diagram of a DRAM in accordance with the embodiments of the present invention. FIG. 3b is a cross-sectional view of the structure of the DRAM in accordance with the embodiments of the present invention.

In a semiconductor device of the present invention, as shown in FIGS. 3a and 3b, a semiconductor substrate 20 functions as a first electrode of a capacitor. On the semiconductor substrate 20, an insulating film 21 and a polysilicon layer pattern 24a are formed. Trenches 28a and 28b are formed through the polysilicon layer pattern 24a, insulating film 21 and partially through the semiconductor substrate 20. A dielectric film 29 is formed on the semiconductor substrate 20 to cover the bottom and side surfaces of the trenches 28a and 28b. The dielectric film 29 extends up within the trenches 28a and 28b so that it ends somewhere between the top and bottom surfaces of the insulating film 21. The trenches 28a and 28b are filled to form storage nodes 33. The storage node 33 electrically connects with the polysilicon layer pattern 24a and functions as a second electrode of the capacitor. A gate insulating film 26 and gate electrodes 32a and 32b are formed on the polysilicon layer pattern 24a. Low concentration and high concentration impurity regions 34 and 36 are formed in the polysilicon layer pattern 24a on both sides of the gate electrodes 32a and 32b. Over the gate electrodes 32a and 32b, a planarizing layer 37 having a bitline contact hole 38 is formed. On the planarizing layer 37 a bitline 39 is formed and contacts the impurity region 36 through the bitline contact hole 38.

A method of manufacturing the semiconductor device having the above-described structure according to the embodiments of the present invention will be described.

Figure 1:
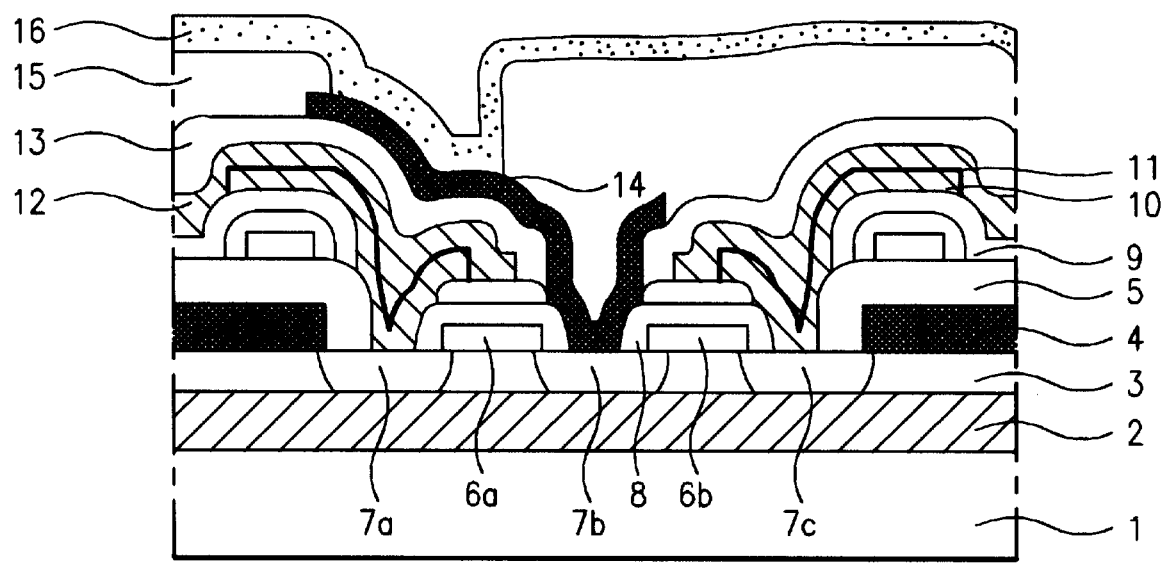
FIG. 1 is a cross-sectional view of the structure of a conventional DRAM.
Figure 2A:
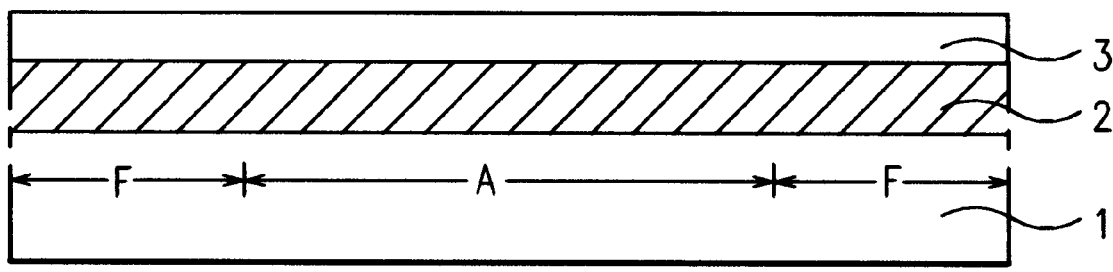
FIGS. 2a to 2h show cross-sectional views for illustrating a conventional method of manufacturing the conventional DRAM
Figure 2B:
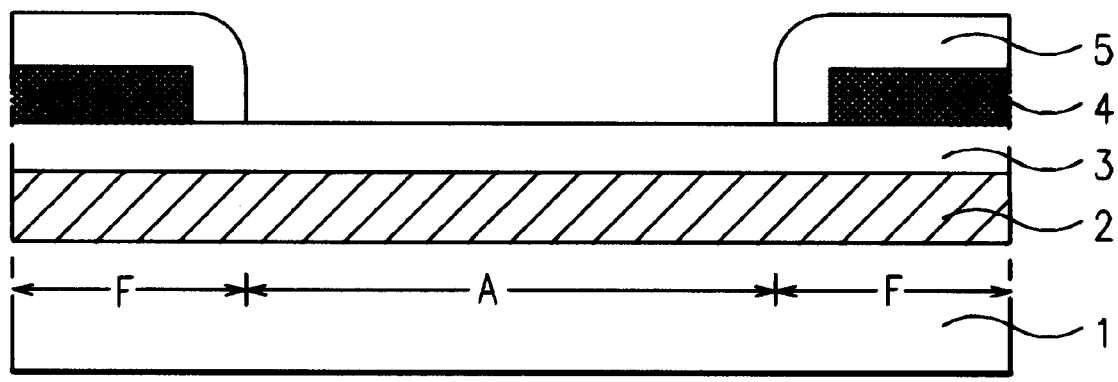
Figure 2C:
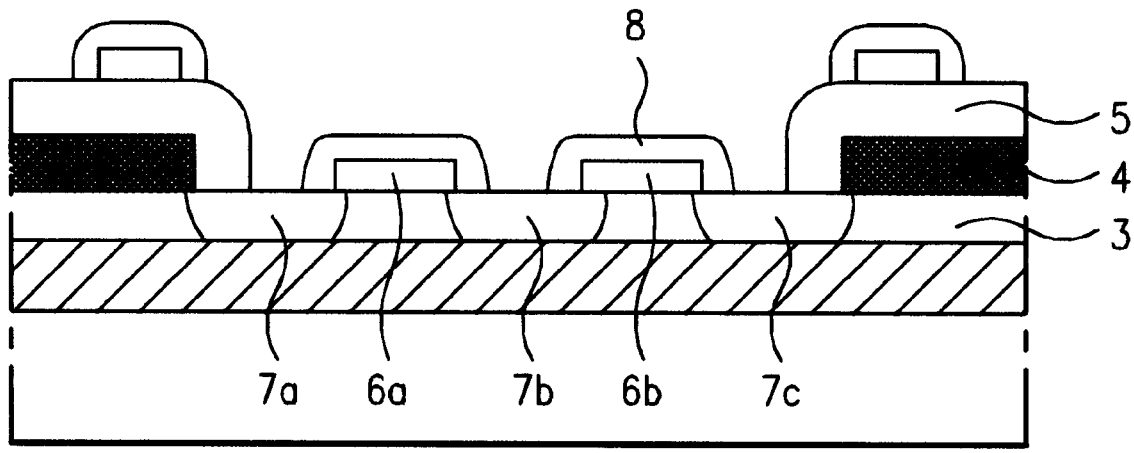
Figure 2D:
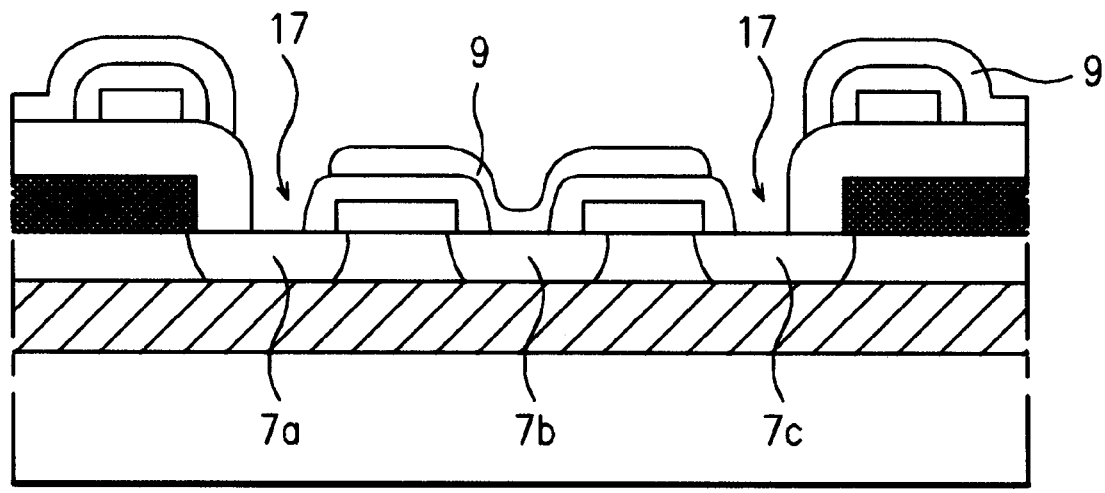
Figure 2E:
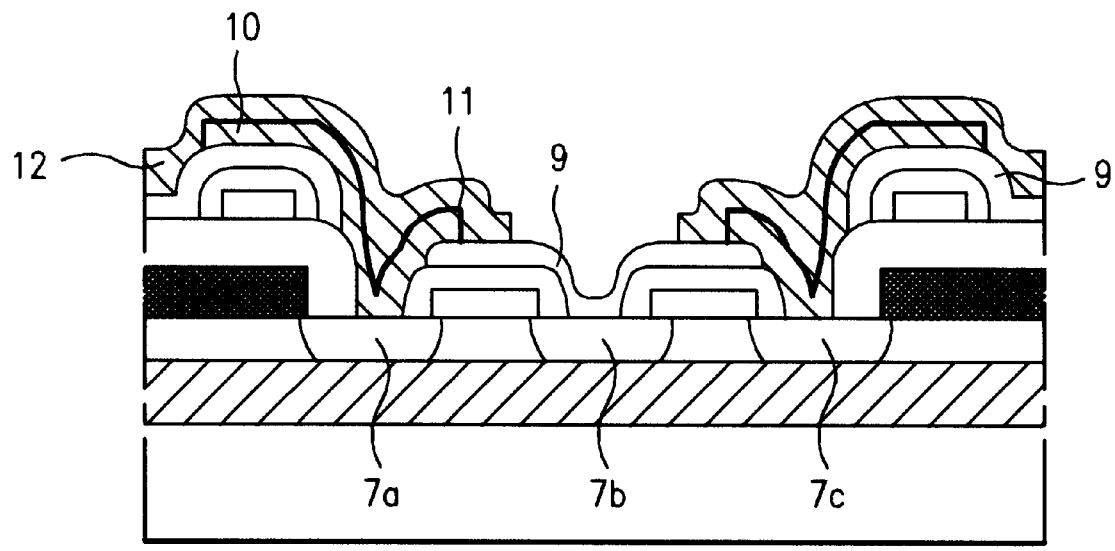
Figure 2F:
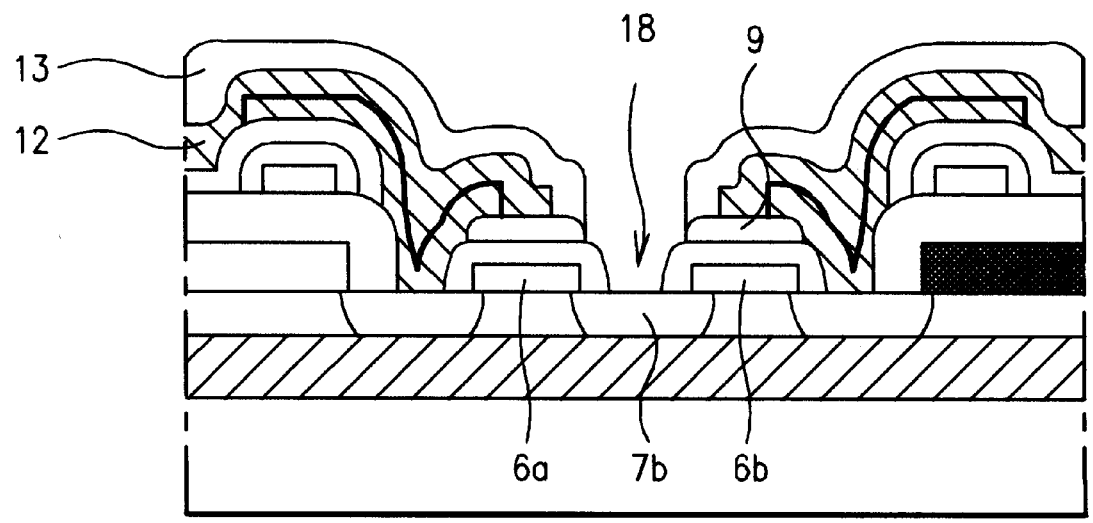
Figure 2G:
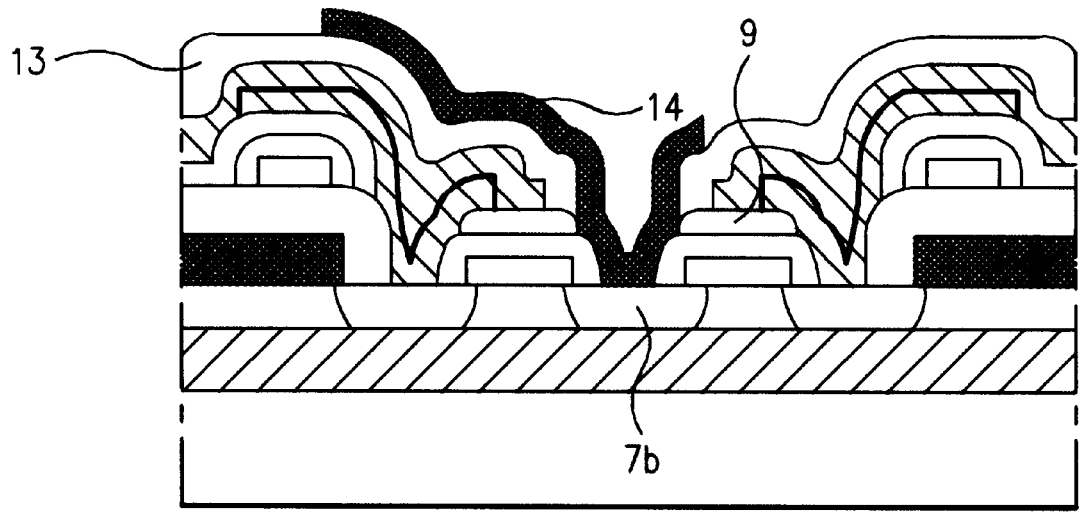
Figure 2H:
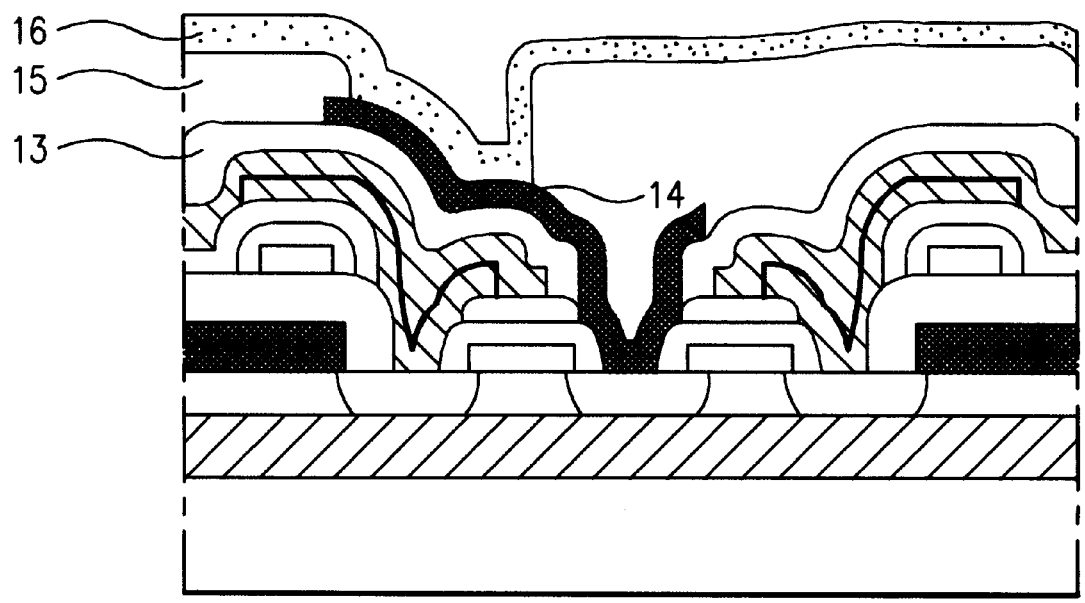
Figure 4A:
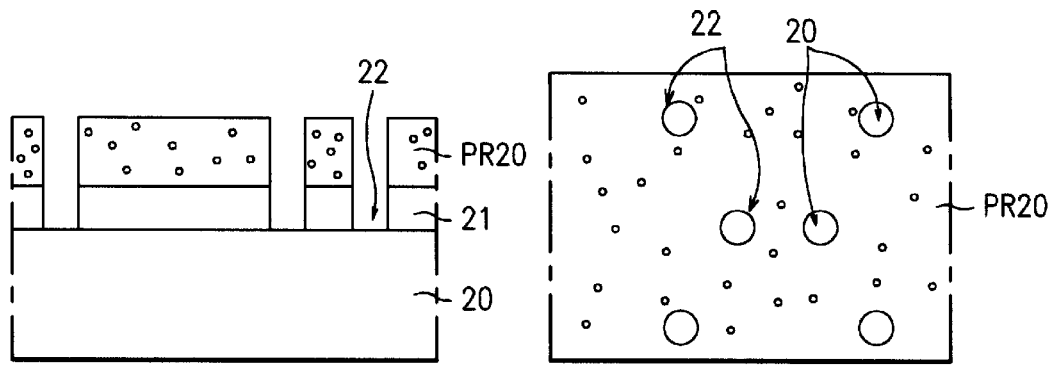

FIGS. 4a-1 selectively to 4m-1 are partial cross-sectional views and FIGS. 4a-2 selectively to 4m-2 are top plan views for illustrating a method of manufacturing the DRAM, taken along line IV–IV' of FIG. 3a.

As shown in FIGS. 4a-1 and 4a-2, an insulating layer and a photoresist layer are deposited on a semiconductor substrate 20. Through exposure and development process, a photoresist pattern PR20 is formed to define a region in which a storage node is to be formed. Using the photoresist pattern PR20 as a mask, the insulating layer is selectively etched and patterned to form an insulating film 21. Through the insulating film 21, a plurality of holes 22 are formed. The insulating film 21 has a thickness of 10~300 nm and is formed of an oxide film or a nitride film. In case that the insulating film 21 is made of the oxide film, the insulating film 21 is formed by thermally oxidizing the substrate or by a chemical vapor deposition (CVD) method.

Figure 4B:
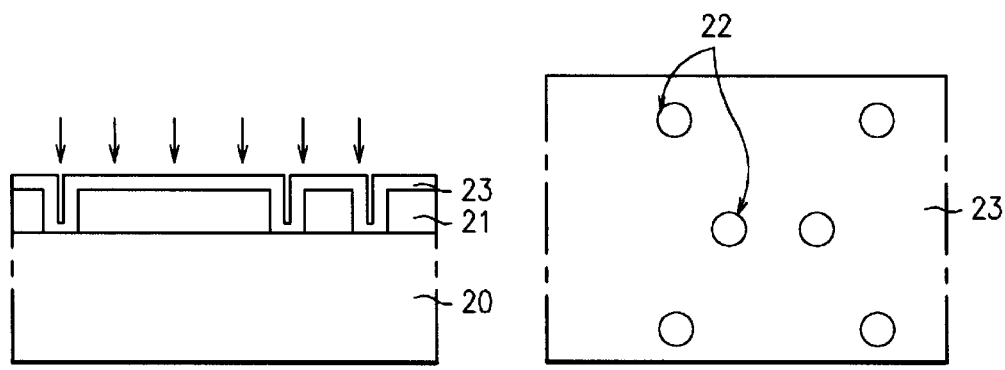

As shown in FIGS. 4b-1 and 4b-2, the photoresist pattern PR20 is completely removed and a first semiconductor layer 23 is formed on the entire surface of the insulating film 21 and in the holes 22. The first semiconductor layer 23 is made of an amorphous silicon and has a thickness of 10~500 nm formed at a temperature below 600° C. by the CVD method. In order to facilitate the solid phase growth of the amorphous silicon, silicon (Si) ion is implanted into the first semiconductor layer 23 at an energy of 10~100 keV with a dose of $10^{12}$~$10^{16}$.

Figure 4C:
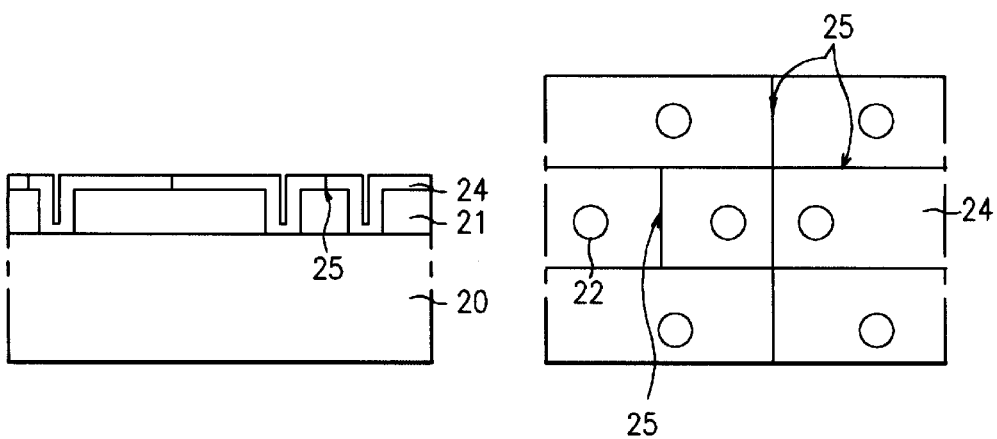

As shown in FIGS. 4c-1 and 4c-2, the first semiconductor layer 23 is annealed at a temperature of 570~650° C. so that the first semiconductor layer 23 is solid phase epitaxialized and changed into a polysilicon layer 24. At the polysilicon layer, a grain boundary 25 is formed between the holes 22.

Figure 4D:
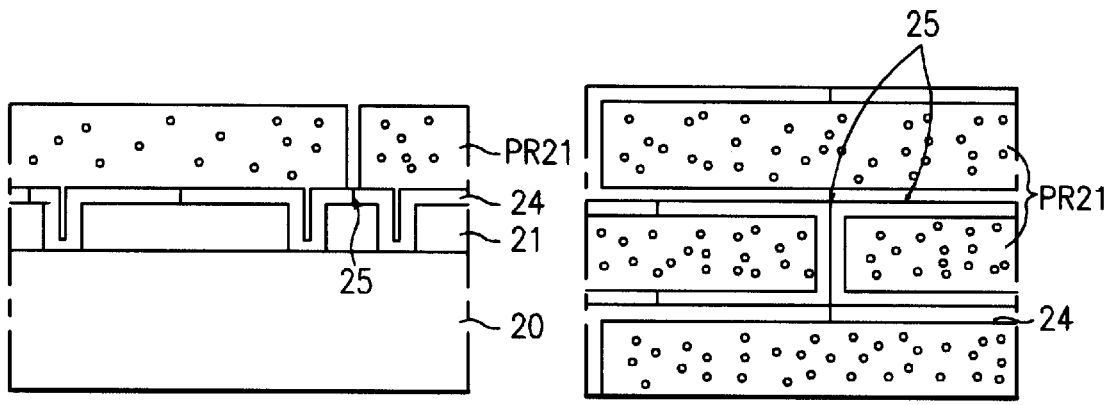

As shown in FIGS. 4d-1 and 4d-2, a photoresist film is deposited on the entire surface of polysilicon layer 24 and patterned by exposure and development process to form a photoresist pattern PR21. The photoresit pattern PR21 defines a region in which a bitline contact hole is to be formed subsequently. The polysilicon layer 24 includes the grain boundary 25 which is exposed through the photoresist pattern PR21. The photoresist pattern PR21 is patterned so that the photoresist pattern PR21 formed on the holes 22 is maintained.

Figure 4E:
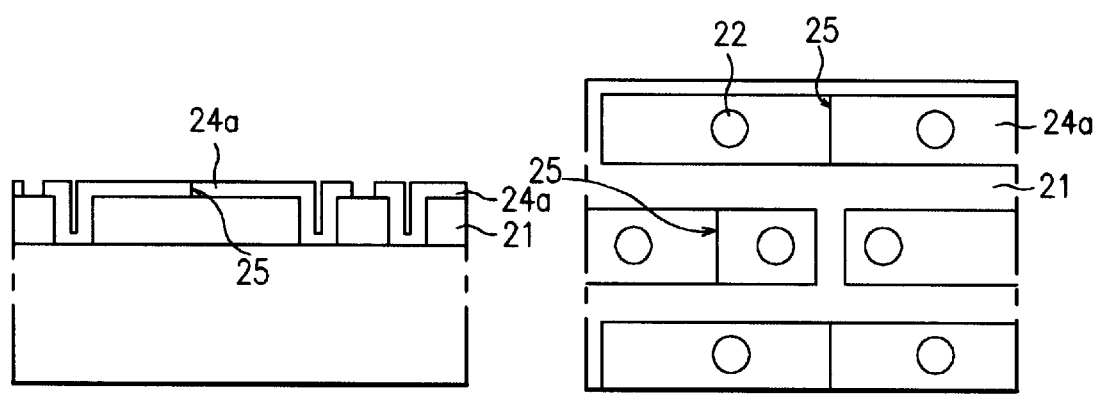

As shown in FIGS. 4e-1 and 4e-2, using the photoresist pattern PR21 as a mask, portions of polysilicon layer 24 having certain grain boundaries 25 are etched to form a polysilicon layer patterns 24a. These certain grain boundaries 25 do not include boundaries 25 formed in a region where the bitline contact hole is to be formed subsequently. That is, the polysilicon layer 24 is patterned into the polysilicon layer patterns 24a so that there is a grain boundary formed between the polysilicon layer patterns 24a. The polysilicon layer patterns 24a expose certain portions of the insulating film 21. Once the polysilicon layer patterns 24a are formed, the photoresist pattern PR21 is completely removed.

Figure 4F:
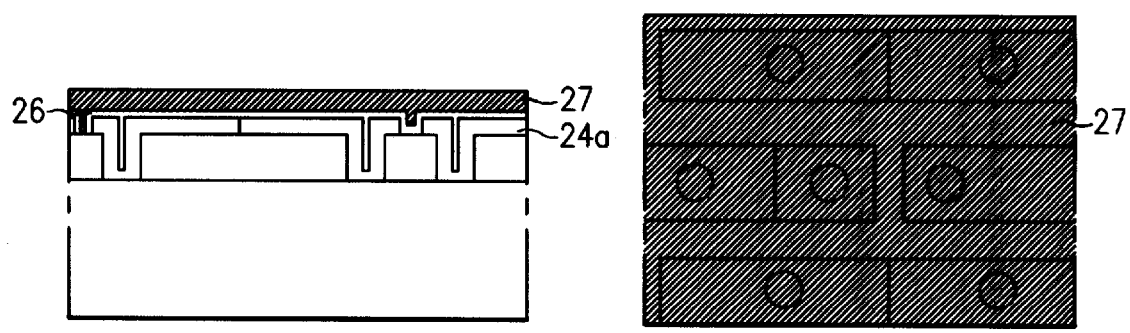

As shown in FIGS. 4f-1 and 4f-2, a gate insulating film 26 and a first conductive layer 27 are formed on the entire surface of polysilicon layer patterns 24a and on the exposed surface of insulating film 21. The gate insulating film 26 is formed of an oxide film or a nitride film by thermally oxidizing the polysilicon layer patterns 24a or by depositing an insulating film using the CVD method. The first conductive layer 27 is formed of any one selected from a polysilicon, a silicide and a refractory metal.

Figure 4G:
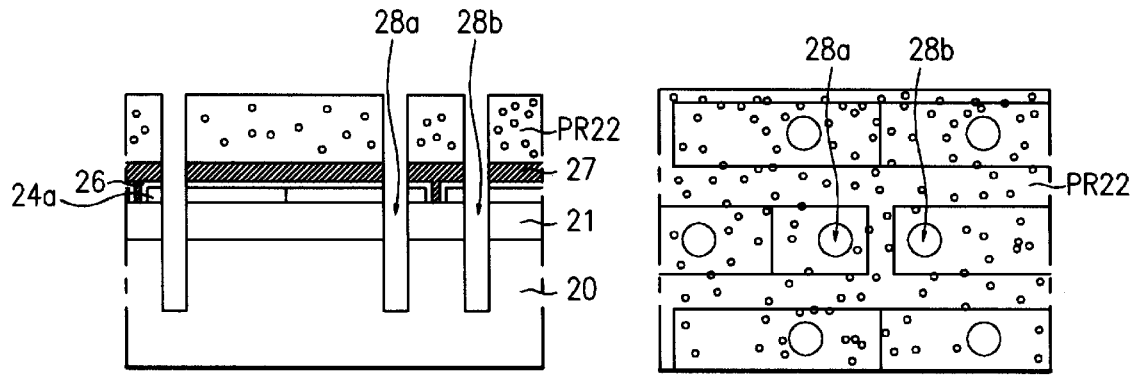

As shown in FIGS. 4g-1 and 4g-2, on the entire surface of the first conductive layer 27 a photoresist film is deposited and patterned through exposure and development process to form a photoresist pattern PR22. Using the photoresist pattern PR22 as a mask, the first conductive layer 27, gate insulating film 26, polysilicon layer pattern 24a within the hole 22, and the semiconductor substrate 20 are etched to a predetermined depth to form first and second trenches 28a and 28b. The first and second trenches 28a and 28b are formed in the polysilicon layer pattern 24a on the right and left of the grain boundary 25.

Figure 4H:
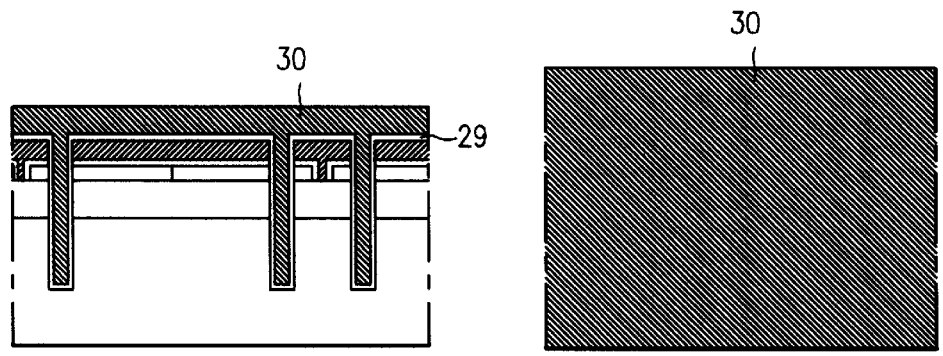

As shown in FIGS. 4h-1 and 4h-2, after completely removing the photoresist pattern PR22, a dielectric film 29 and a second conductive layer 30 are sequentially formed on the entire surface of first conductive layer 27 and in the first and second trenches 28a and 28b. The second conductive layer 30 is formed using polysilicon.

Figure 4I:
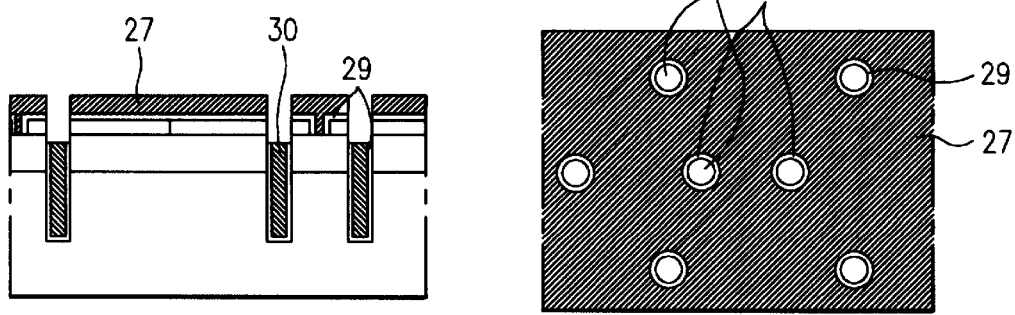

As shown in FIGS. 4i-1 and 4i-2, the second conductive layer 30 is etched back so as to expose the side of insulating film 21 within the first and second trenches 28a and 28b. The portion of the second conductive layer 30 on the dielectric film 29 above the polysilicon layer pattern 24a is completely removed. The dielectric film 29 is also etched to expose the side of insulating film 21 in the first and second trenches 28a and 28b by a wet etching method. As a result, the second conductive layer 30 and dielectric film 29 fill the trenches 28a and 28b up to somewhere between the upper and lower surfaces of the insulating film 21.

Figure 4J:
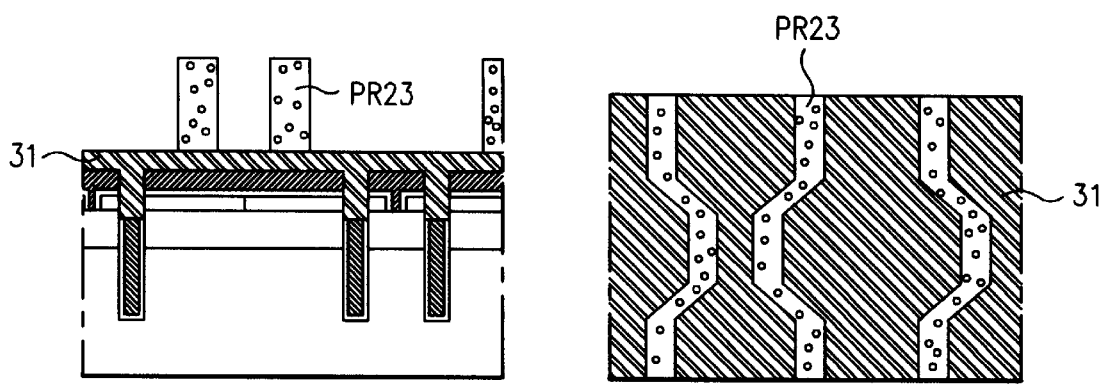

As shown in FIGS. 4j-1 and 4j-2, a third conductive layer 31 made of a polysilicon is formed on the entire surface of first conductive layer and on the second conductive layer 30 in the trenches. On the third conductive layer 31, a photoresist film is deposited and patterned through exposure and development process to form a photoresit pattern PR23. The photoresit pattern PR23 defines a region in which a gate electrode is to be formed subsequently.

Figure 4K:
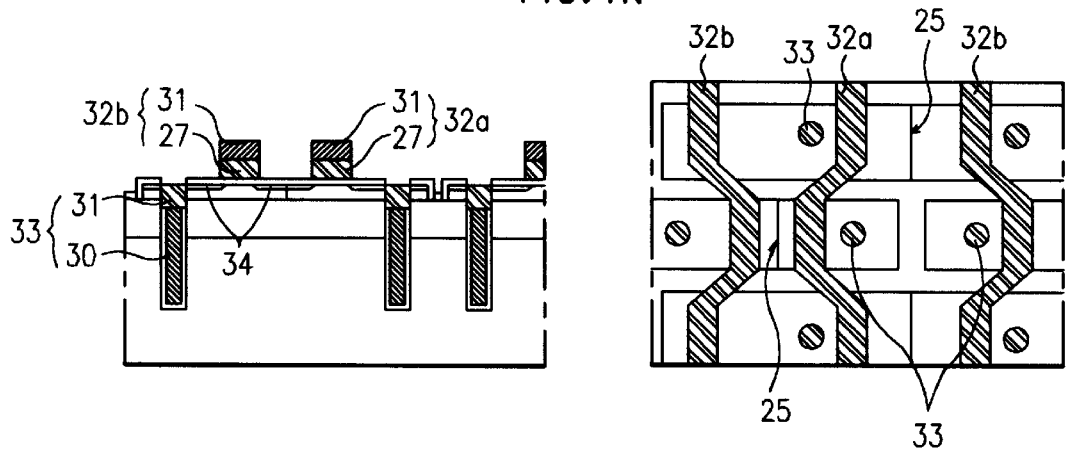

As shown in FIGS. 4k-1 and 4k-2, using the photoresist pattern PR23 as a mask, the third conductive layer 31 and first conductive layer 27 are sequentially etched to form the first and second gate electrodes 32a and 32b. These layers are etched by a dry etching method. A top portion of the third conductive layer 31 in the first and second trenches 28a and 28b and the portion of third conductive layer 31 around the first and second trenches 28a and 28b are completely removed from the gate insulating film 26. Therefore the third conductive layer 31 remains as part of the first and second gate electrodes 32a and 32b and in the first and second trenches 28a and 28b. In each trench 28a and 28b, the third conductive layer 31 is etched until the side of gate insulating film 26 is exposed so as to form a storage node 33. The storage node 33 is composed of the second conductive layer 30 and the third conductive layer 31. In the trenches 28a and 28b, the dielectric film 29 is located on the side and lower surfaces of the storage node 33 and surrounded by the semiconductor substrate 20. This allows the semiconductor substrate 20 to be used as a plate node.

Through an implantation process of low concentration impurity ions using the first and second gate electrodes 32a and 32b as a mask, low concentration impurity diffusion regions 34 are formed in the polysilicon layer pattern 24a on both sides of the first and second gate electrodes 32a and 32b. The low concentration impurity ions such as phosphorus (P) and arsenic (As) are used in NMOS, whereas the impurity ions such as boron (B) are used in PMOS.

Figure 4L:
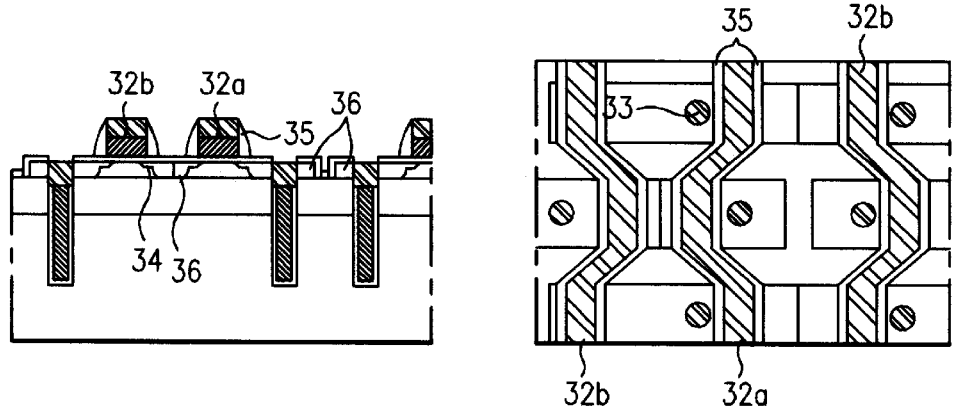

As shown in FIGS. 4l-1 and 4l-2, sidewall spacers 35 are formed on the sides of first and second gate electrodes 32a and 32b. Using the sidewall spacers 35 and the first and second gate electrodes 32a and 32b as a mask, an impurity ion of high concentration is implanted into the polysilicon layer pattern 24a on both sides of first and second gate electrodes 32a and 32b. As a result, high concentration impurity diffusion regions 36 are formed adjacent to the low concentration impurity diffusion regions 34.

As shown in FIGS. 4m-1 and 4m-2, a planarizing layer 37 is formed on the entire surface of the substrate including the first and second gate electrodes 32a and 32b. Then the portion of planarizing layer 37 between the first and second gate electrodes 32a and 32b above the high concentration impurity diffusion region 36 is removed to form a bitline contact hole 38. A conductive layer is deposited on the entire surface of planarizing layer 37 and in the bitline contact hole 38. The conductive layer is selectively patterned by photolithography and etching to form a bitline 39 intersecting the first and second gate electrodes 32a and 32b. The bitline 39 is made of polysilicon.

The DRAM in accordance with the embodiments of the present invention has the following advantageous effects.

First, the semiconductor device is completely separated from the semiconductor substrate by a gate insulating layer. A polysilicon layer having a boundary is formed below the insulating layer by a phase epitaxy method. Therefore crystal defects in the polysilicon layer are avoided. A high speed operation is achieved due to the complete separation of the semiconductor device from the substrate. Generation of a parasitic device is prevented so as to improve the reliability of the semiconductor device.

Secondly, a plurality of trenches extend from the semiconductor substrate through an insulating film and the polysilicon layer, and each trench is filled with a conductive material so that it functions as a storage node. Therefore, by varying the depth of the trench, the capacitance of the semiconductor device is increased, resulting in a highly integrated semiconductor memory device.

It will be apparent to those skilled in the art that various modifications and variations can be made in a semiconductor device and a method of manufacturing the same of the present invention without departing from the spirit or scope of the invention. Thus, it is intended that the present invention cover the modifications and variations of this invention provided they come within the scope of the appended claims and their equivalents.

What is claimed is:

1. A method of manufacturing a semiconductor device, comprising the steps of:

forming an insulating film pattern on a semiconductor substrate;

forming a semiconductor layer pattern on said insulating film pattern;

sequentially forming a gate insulating film and a first conductive layer on said semiconductor layer pattern;

forming a trench in said semiconductor substrate through said first conductive layer, said gate insulating film, said semiconductor layer pattern, and said insulating film pattern;

forming an electrode of a capacitor in said trench;

forming a gate electrode on said gate insulating film; and forming impurity regions in said semiconductor layer pattern.

2. A method of manufacturing a semiconductor device as claimed in claim 1, further comprising:

forming a dielectric film on side and bottom surfaces of said trench.

3. A method of manufacturing a semiconductor device as claimed in claim 10, wherein said step of forming said electrode of the capacitor includes the steps of:

forming a second conductive layer in said trench; and forming a third conductive layer on said second conductive layer in said trench.

4. A method of manufacturing a semiconductor device as claimed in claim 1, wherein said step of forming said gate electrode includes the step of:

forming a third conductive layer on said first conductive layer so that said electrode is composed of said first and third conductive layers.

5. A method of manufacturing a semiconductor device as claimed in claim 1, further comprising:

forming sidewall spacers on sides of said gate electrode.

6. A method of manufacturing a semiconductor device as claimed in claim 1, wherein said semiconductor layer pattern includes a grain boundary formed thereon.

7. A method of manufacturing a semiconductor device as claimed in claim 6, further comprising:

forming a planarizing layer on said gate electrode and defining a bitline contact hole through said planarizing layer; and forming a bitline on said planarizing layer and in said bitline contact hole.

8. A method of manufacturing a semiconductor device as claimed in claim 7, wherein said bitline contact hole is formed above said grain boundary of said semiconductor layer pattern.

9. A method of manufacturing a semiconductor device as claimed in claim 1, wherein said insulating film pattern and said gate insulating film are formed using one of oxide and nitride.

10. A method of manufacturing a semiconductor device as claimed in claim 1, wherein said semiconductor layer pattern is formed using polysilicon.

11. A method of manufacturing a semiconductor device as claimed in claim 1, wherein said step of forming said insulating layer pattern includes the steps of:

forming an insulating film on said semiconductor substrate; and selectively removing said insulating film to form a plurality of holes.

12. A method of manufacturing a semiconductor device as claimed in claim 11, wherein said insulating film is formed by thermally oxidizing said semiconductor substrate or by a chemical vapor deposition process.

13. A method of manufacturing a semiconductor device as claimed in claim 11, wherein said insulating film has a thickness of approximately 10~300 nm.

14. A method of manufacturing a semiconductor device as claimed in claim 11, wherein said step of forming said semiconductor layer pattern includes the steps of:

forming a semiconductor layer on said insulating film pattern and in said plurality of holes;

annealing said semiconductor layer to form grain boundaries between said plurality of holes; and selectively removing said semiconductor layer having said grain boundaries so that said semiconductor layer having said grain boundaries corresponding to a bitline contact hole remains.

15. A method of manufacturing a semiconductor device as claimed in claim 14, wherein said semiconductor layer is formed of an amorphous silicon.

16. A method of manufacturing a semiconductor device as claimed in claim 15, wherein said amorphous silicon is deposited to form said semiconductor layer by a chemical vapor deposition method.

17. A method of manufacturing a semiconductor device as claimed in claim 14, wherein said semiconductor layer is formed at a temperature below 600° C.

18. A method of manufacturing a semiconductor device as claimed in claim 14, wherein said semiconductor layer has a thickness of approximately 10~500 nm.

19. A method of manufacturing a semiconductor device as claimed in claim 1, wherein said step of forming said semiconductor layer pattern includes the step of:

solid-phase-epitaxializing an amorphous silicon.

20. A method of manufacturing a semiconductor device as claimed in claim 19, wherein said step of forming said semiconductor layer pattern further includes the step of:

implanting silicon ions into said amorphous silicon.

21. A method of manufacturing a semiconductor device as claimed in claim 20, wherein said silicon ions are implanted at an energy of approximately 10~100 keV with a dose of approximately b $10^{12}$~$10^{16}$.

22. A method of manufacturing a semiconductor device as claimed in claim 14, wherein said annealing step is performed at an annealing temperature of approximately 570~650° C.

23. A method of manufacturing a semiconductor device as claimed in claim 1, wherein said first conductive layer is formed of one of a polysilicon, a silicide and a refractory metal.

24. A method of manufacturing a semiconductor device as claimed in claim 1, wherein said gate insulating film is formed by thermally oxidizing said semiconductor layer pattern.

25. A method of manufacturing a semiconductor device as claimed in claim 3, wherein said second and third conductive layers are formed using polysilicon.

* * * * *